United States Patent [19]

Poljak

[11] Patent Number: 4,659,994
[45] Date of Patent: Apr. 21, 1987

[54] BATTERY TESTER

[75] Inventor: Mark D Poljak, Dahlgren, Va.

[73] Assignee: The United States of America as represented by the Secretary of the Navy, Washington, D.C.

[21] Appl. No.: 764,687

[22] Filed: Aug. 12, 1985

[51] Int. Cl.$^4$ .............................................. G01N 27/46
[52] U.S. Cl. .................................... 324/426; 320/48; 324/427; 324/434; 340/636
[58] Field of Search ............... 324/426, 427, 429, 434; 320/48; 340/636

[56] References Cited

U.S. PATENT DOCUMENTS

| | | | |
|---|---|---|---|
| 3,546,576 | 8/1975 | Frezzolini | 324/29.5 |
| 3,899,732 | 9/1975 | Staby | 324/29.5 |
| 3,974,441 | 8/1976 | Van Den Haak | 324/29.5 |
| 4,193,025 | 3/1980 | Frailing et al. | 324/427 |
| 4,290,021 | 9/1981 | Theron et al. | 324/429 |
| 4,307,330 | 12/1981 | Belot | 320/48 X |
| 4,322,685 | 2/1982 | Frailing et al. | 324/429 |
| 4,388,618 | 6/1983 | Finger | 340/636 |
| 4,521,735 | 6/1985 | Kogeyama et al. | 324/426 |
| 4,547,770 | 10/1985 | Suzuki et al. | 340/636 |

FOREIGN PATENT DOCUMENTS 0084562 7/1981 Japan .................... 324/426

Primary Examiner—Reinhard J. Eisenzopf
Assistant Examiner—Robert W. Mueller
Attorney, Agent, or Firm—Elmer E. Goshorn; Thomas E. McDonnell

[57] ABSTRACT

An improved battery tester for determining the acceptability of a Lithium Sulfur Dioxide (LiSO$_2$) storage battery at a given temperature and with one or more cells therein. The tester is generally made up of a first comparison circuit having a series of series interconnected components, namely a comparator, first and second flip-flops, and an AND gate. A first resistor is parallel connected to the first comparison circuit. A second comparison circuit is also parallel connected to the first comparison circuit and is generally made up of a series of series interconnected components, namely a second resistor, a capacitor, a buffer, and a second comparator. A first switch is connected to the first resistor and a second switch is parallel connected to the second comparison circuit between the capacitor and the buffer. A logic control arrangement controls the operation of both switches, both comparators, and both flip-flops for testing a battery as to its start-up voltage and performance voltage characteristics all in a relatively short time period. In another embodiment of the tester, it is provided with an analog-to-digital converter, a memory and a sensor arrangement for enhancing the versatility and reliability of the tester in determining the acceptability of a LiSO$_2$ battery. By virtue of the tester being of generally solid-state construction, it requires minimal power usage and can be readily incorporated into battery-powered equipment for enabling testing of a battery at any location where the equipment is to be used.

10 Claims, 4 Drawing Figures

BATTERY TESTER

This invention relates to a battery tester and more particularly to an improved battery tester for testing Lithium Sulfur Dioxide (LiSO$_2$) electric storage batteries.

BACKGROUND OF THE INVENTION

Various battery testers have been designed in the past for not only checking to see if the battery is operable at its predetermined rated voltage but also if the battery will operate satisfactorily after being subjected to a load for a predetermined test time period. U.S. Pat. No. 3,974,441 to Van Den Haak concerns a portable battery tester. The tester is generally made up of a manually operable switch, a voltage-divider resistance network and two light emitting diode (LED) branch networks that are parallel connected across the voltage-divider network. Depending upon the initial and subsequent time load operation as effected by selective operator closure of the switch, the LEDs will indicate GO or NOGO conditions for the battery being tested. U.S. Pat. No. 3,546,576 concerns a battery discharge tester. The tester is generally made up of an externally powered bridge test circuit for applying a predetermined reference load to a battery to be tested and for visually indicating when the discharging battery being tested fails to meet its requirements under referenced load conditions. U.S. Pat. No. 3,899,732 to Staby concerns a battery-operated fire detection and alarm system. The system is provided with separate devices for continuously monitoring the energy level of a battery being used for the system and for subjecting the battery to periodic minute loads of predetermined value such that when the battery falls below a certain value, the monitoring device triggers the alarm in a different manner so that it indicates the battery needs to be replaced. U.S. Pat. No. 4,290,021 to Theron et al concerns a battery tester. The species of FIG. 1 is deemed pertinent. This species is generally made up of a buffer circuit for initially testing the battery to determine if the battery is sufficiently charged. If so, the battery then is finally tested by being subjected to a preselected load circuit for a predetermined time period. U.S. Pat. No. 4,193,025 and 4,322,685 both to Frailing et al., each relates to a combined battery tester and analyzer for automatically subjecting a lead-acid battery to one or more different tests and then for visually displaying the analysis of each test. The combined tester and analyzer is generally made up of a series of three test circuits for carrying out the different tests of a battery for acceptability and additional fourth and fifth circuits for giving a readout at the end of each test as well as for maintaining the test sequence of the three test circuits. However, none of the aforediscussed references, whether taken alone or in any combination, remotely suggest an improved adjustable battery tester for testing the acceptability of single or multiple cell LiSO$_2$ batteries under various temperature conditions and having, among other things, first and second comparison circuit means and logic control means for timely actuating various components of the circuit means so as to subject a battery at a given temperature not only to an initial test for evaluating its start-up voltage under load but also to a subsequent test for evaluating its output voltage under load after a predetermined period of time.

SUMMARY OF THE INVENTION

An object of this invention is to provide an improved battery tester for automatically testing a single or multiple cell LiSO$_2$ battery Another object of the invention is to provide an improved battery tester that is simple to operate and is useable in the field by unskilled personnel.

Still another object of the invention is to provide an improved battery tester that uses logic circuitry for controlling the operation of a series of two different tests for evaluating the acceptability of a LiSO$_2$ battery and with the series of tests being within a relatively short time period.

Yet another object of the invention is to provide an improved battery tester that may be incorporated into battery-powered equipment for repeated use.

In summary, the improved tester for single or multiple cell LiSO$_2$ batteries is generally comprised of a first comparison circuit means having a series of series-interconnected comparator means, first and second flip-flop means, and AND gate means. The forward bias input of the comparator means is connected to a terminal of a battery to be tested. The input of the first flip-flop means is connected to the output of the comparator means. An input of the AND gate means is connected to the output of the first flip-flop means. The output of the AND gate means is connected to the input of the second flip-flop means. A first resistor means is parallel connected to the first comparison circuit means and is series connected to a bridge-contact terminal of a first normally-open, solenoid operated switch.

A second comparison circuit means is generally made up of a series of series interconnected second resistor means, capacitor means, buffer means and second comparator means. The second resistor means is parallel connected to the first comparison circuit means between the first resistor means and the first comparator means. The output of the buffer means is connected to the forward bias input of the second comparator means. The output of the second comparator means is connected to another input of the AND gate means. A bridge-contact terminal of a second normally closed, solenoid-operated switch is parallel connected between the output of the capacitor means and the input of the buffer means.

Logic control means is provided for controlling the timely operation of various means of the first and second comparison circuit means to carry out a series of two different tests for determining the acceptability of a LiSO$_2$ battery at a given temperature. To this end, the logic means is made up of first and second lead means connected to the solenoid means of the first and second switch means. Further, the logic means is comprised of third and fourth lead means connected to another input of the first and second flip-flop means for controlling the triggering of the flip-flop means. The logic means preferably provides negative source means including lead means with an adjustable potentiometer for connection to the negative bias input of the comparator means of each circuit means.

When the logic means on/off switch is closed and its illumination means indicates a battery is being tested, the tester operates in the following manner. The logic means initially energizes the solenoid means of the first switch means thereby placing the battery under load. The logic means by its third lead means transmits a timely pulse for triggering the first flip-flop means when the output of the first comparator means is sufficient as the result of the battery under test providing adequate start-up voltage input to the first comparator means. After the second solenoid means is energized by the logic means, the fourth lead means transmits a timely pulse to the second flip-flop means for triggering same to provide an outout, if the AND gate means has furnished an input to the second flip-flop means. Assuming that the output of the second comparator means to its AND gate means input is sufficient together with the first comparator means output being sufficient to its input of the AND gate means, then the second flip-flop means after being triggered, will provide an output indicative of an acceptable battery. Illumination means is parallel connected to the output of the second flip-flop means for visually indicating the acceptability of the battery. If the battery is unacceptable, the logic means illumination means pulsates on and off.

In another advantageous embodiment of the invention as illustrated in FIG. 4, the tester is provided with improved and adjustable logic control means, a sensor apparatus, an analog-to-digital converter and a memory. By virtue of the logic control means being responsive to more conditions and being operable in digital fashion to readily test any $LiSO_2$ battery, the improved $LiSO_2$ battery tester of FIG. 4 provides greater reliability than the species of FIGS. 1–3.

Other objects and advantages of the invention will become apparent when taken in conjunction with the specification and drawings as follows.

DETAILED DESCRIPTION OF THE INVENTION

Figure 1:
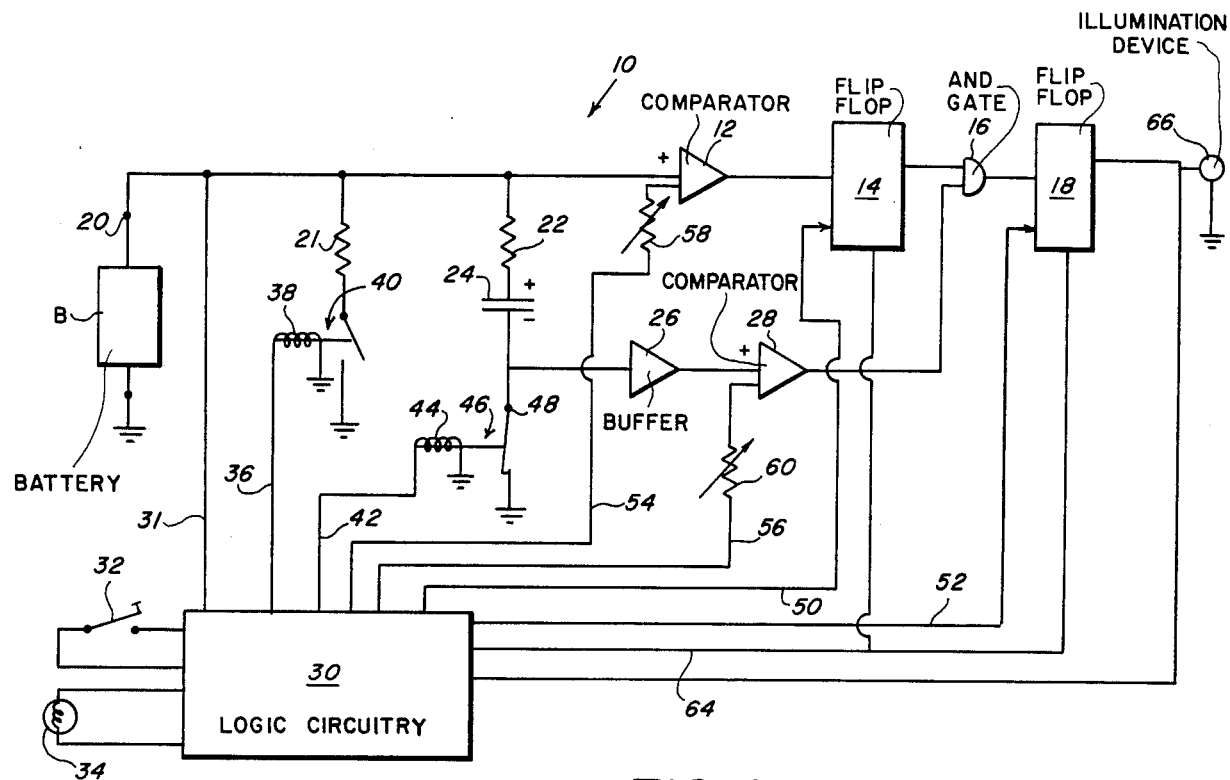
FIG. 1 is a schematic view of an embodiment of the improved adjustable battery tester of the invention.

With further reference to FIG. 1, battery tester 10 is generally made up of a first comparison circuit having a first series of series interconnected components, namely: a first comparator device 12, a first flip-flop 14, an AND gate 16 and a second flip-flop 18. The forward bias input of device 12 is connected to a terminal 20 at the battery test station. A first resistor 21 is parallel connected to the first comparison circuit between terminal 20 and device 12. The output of flip-flop 14 is connected to an input of AND gate 16. Tester 10 is also generally made up of a second comparison circuit having a second series of series interconnected components, namely: a second resistor 22, a capacitor 24, a buffer 26, and a second comparator device 28. Resistor 22 is also parallel connected to the first comparison circuit between resistor 21 and comparator 12. The output of comparator device 28 is connected to another input of AND gate 16.

A logic control arrangement 30 is connected to various components of the first and second comparison circuits for timely controlling the operation of same. The power input to logic arrangement 30 is preferably effected by a lead input 31 being parallel connected to the first comparison circuit between battery terminal 20 and resistor 21. A momentary switch 32 is provided for selectively turning on logic control arrangement 30 during tester use. An illumination device 34 is connected to logic 30 for indicating when it is turned on for evaluating a battery connected at the test station. A first output lead 36 of logic 30 is connected to a solenoid 38 of a normally-open bridge-contact switch 40. Resistor 21 is connected to one bridge-contact terminal of the switch. A second output lead 42 of logic 30 is connected to a solenoid 44 of a second normally-closed, bridge-contact switch 46. One bridge-contact terminal 48 of switch 46 is parallel connected to the second comparison circuit between capacitor 24 and buffer 26. A third output lead 50 of logic 30 is connected to another input of first flip-flop 14 for triggering an output from flip-flop 14 when the output voltage of device 12 is sufficient and when a pulse is timely transmitted from logic 30 via lead 50 to the flip-flop. A fourth output lead 52 of logic 30 is also connected to another input of second flip-flop 18 for triggering an output from flip-flop 18 when there is an output from gate 16 and when there is a pulse timely transmitted from logic 30 via lead 52 to the flip-flop. Leads 54 and 56 of logic 30 are connected to the negative bias input of comparator for devices 12 and 28 such that logic 30 provides a negative bias source through leads 54 and 56 to devices 12 and 28. Adjustable potentiometers 58 and 60 are connected to leads 54 and 56 for controlling the voltage of the negative bias being applied to devices 12 and 28 in relation to the battery at a given temperature being tested by tester 10. Another output lead 64 of logic 30 is parallel connected to flip-flops 14 and 18 for timely transmitting a pulse to each flip-flop 14 and 18 for the purpose of reinitiating same at the beginning of each battery test cycle of tester 10. An illumination device 66 is parallel connected to the output of flip-flop 18 for visually indicating when a battery is acceptable.

Figure 2:
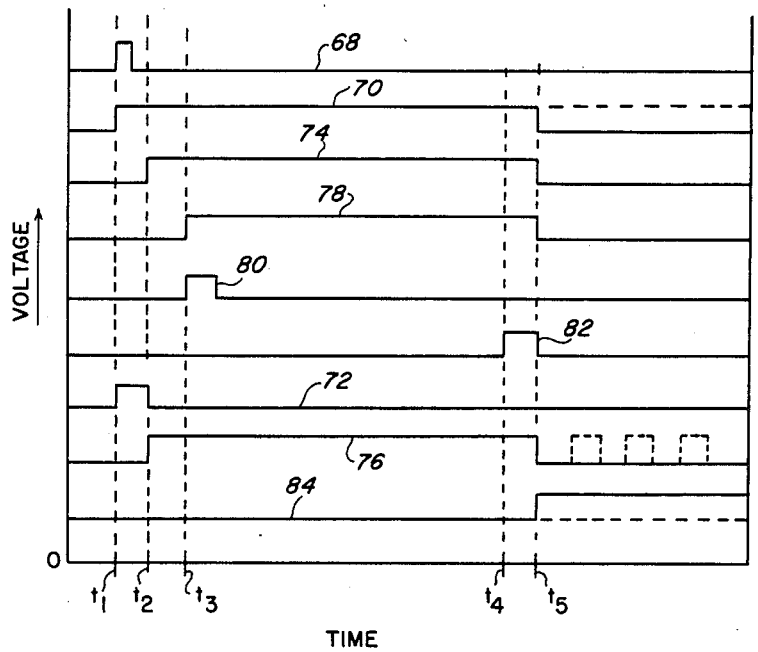
FIG. 2 is a graphical view of a series of different voltage/time curves in dotted and/or solid lines for various components of the tester and illustrates the particular operational characteristics of each component voltage/time curve in relation to the voltage/time curves of the other components.

With reference to FIG. 2, a series of voltage-time curves are illustrated for various components of tester 10 during a test cycle. Curve 68 indicates when logic momentary switch 32 is momentarily closed by the user at $t_1$ thereby turning on logic control arrangement 30 for at least a time period from $t_1$ to $t_5$ for a test cycle of a battery B. as indicated by curve 70. Immediately after turning on logic 30 it transmits a pulse through lead 64 and with a time period from $t_1$ to $t_2$ as indicated by curve 72 for reinitiating first and second flip-flops 14 and 18 so that they are preset for another test cycle. After reinitiating the flip-flops, logic 30 at $t_2$ transmits a signal via lead 36 to energize solenoid 38 so as to close normally open switch 40 between $t_2$ and $t_5$ of a test cycle as indicated by curve 74. Closing switch 40 connects resistor 21 to battery B. At the same time switch 40 is closed, device 34 of logic 30 is illuminated as shown by curve 76 thereby indicating that a battery test cycle of tester 10 is being conducted. At time $t_3$, logic 30 transmits a signal via lead 42 for energizing solenoid 44 so as to open normally closed switch 46 between $t_3$ and $t_5$ of a test cycle as indicated by curve 78. Prior to switch 46 being opened and with a battery B being connected to tester 10, it is to be understood that transients are discharged to ground through switch 46. Also, resistor 22 functions to prevent excessive current through capacitor 24. At $t_3$ logic 30 transmits a pulse 80 via lead 50 for triggering flip-flop 14. Flip-flop 14 will provide an output if the output of comparator 12 is sufficient thus indicating that a battery B has a terminal voltage substantially equal to its desired start-up voltage at a given temperature. With switch 46 now open at $t_3$, battery B is connected to resistors 21 and 22 and buffer 26 that has a high impedance. At $t_4$ just before the end of a test cycle, logic 30 transmits a pulse 82 for triggering flip-flop 18. If the voltage output of a battery B substantially meets its expected performance curve characteristic at time $t_4$, as will be more fully explained in FIG. 3, then the output of comparator 28 will be sufficient to the other input of AND gate 16. Assuming that flip-flop 14 has also provided an output to AND gate 16, then the gate will provide an output to flip-flop 18. With flip-flop 18 triggered by pulse 82 then the flip-flop provides an output for illumination device 66 at $t_5$ as shown by the solid line of signal 84. With device 66 indicating battery B, as acceptable, logic 30 is turned off at $t_5$ as shown by the solid line of signal 70. Then device 66 is turned off when the accepted battery is disconnected before test of another battery B by tester 10.

Assuming that the output of either device 12 or 28 or both is insufficient then AND gate 16 would not provide an output and thus device 66 would not be illuminated at $t_5$, as shown by the series of dotted lines of signal 84 thereby indicating a nonacceptable battery B. With nonillumination of device 66, logic 30 remains turned-on as shown by the series of dotted lines of signal 70 in order to transmit a pulsating signal to device 34 so that it flashes on and off as shown by the series of dotted pulse lines of signal 76. Flashing device 34 clearly indicates nonacceptability of a battery B and it continues flashing until the nonacceptable battery is disconnected from tester.

Figure 3:
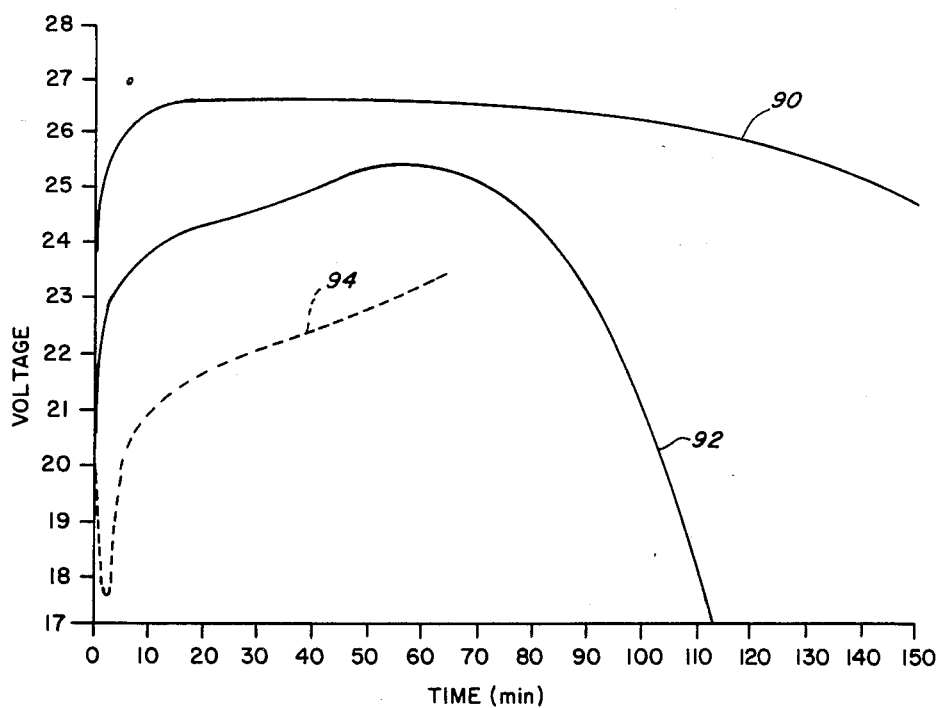
FIG. 3 is another graphical view of voltage verse time and illustrates various performance curves, for different temperature conditions, in either dotted or solid lines that indicate the acceptability of a series of tested multicell $LiSO_2$ batteries.

With reference to FIG. 3, a series of three different performance curves is illustrated for a battery or battery pack B where the battery pack as represented by each curve is made up of a series of ten series interconnected D-cells at a given temperature, and where the battery pack for each curve has been tested by tester 10 of the invention. Such a multicell battery pack normally has a nominal rated voltage of twenty-four volts (24.0 v). Solid line curve 90 indicates the typical performance characteristic curve of a battery pack that operates at a temperature of twenty-five degrees Celsius (25° C.). Upon the battery pack being placed under load by tester 10 (on the order of twelve ohms) its voltage output starts at about twenty-two and a half volts (22.5 v) and then rapidly increases to a peak voltage of about twenty-six and a half volts (26.5 v) all within approximately twenty minutes (20 min.). For the next one hundred and thirty minutes (130 min.), the voltage output of the battery as shown by curve 90 gradually decays from its peak voltage to a lower voltage of about twenty-five volts (25 v). Similarly, solid line curve 92 is for a battery pack that is operating at a temperature of minus twenty-three degrees Celsius (−23° C.) and with its startup voltage being twenty volts (20 v). The peak voltage of a battery represented by curve 92 is twenty-five and a half volts (25.5 v) after about sixty minutes (60 min.) of use under a twelve ohm load. In view of battery performance curves 90 and 92, it is evident that $LiSO_2$ ten-cell battery packs at different temperatures have different start-up voltages than their nominal rated voltages. However, these curves 90 and 92 for ten-cell battery packs at different temperatures all rapidly increase to a peak voltage under load and maintain a fairly steady output voltage under load for a reasonable period of time. As indicated by curve 92 for a battery at a lower temperature, it has a shorter useful life. In any event, performance curves 90 and 92 represent acceptable batteries that can be used by battery-powered equipment.

On the other hand, if a battery pack at a given temperature is not acceptable, it will not have the initial rapid-rise, steep upward slope characteristics of an acceptable $LiSO_2$ battery pack as indicated by curves 90 and 92. Instead, a nonacceptable battery at a temperature of minus 23° C. will have a start-up voltage of 20 v but then, the battery, when it is under a 12 ohm load, will immediately exhibit a steep and rapid drop in voltage to its lowest voltage drop of about seventeen and a half volts (17.5 v) all within about two and a half minutes, as indicated by dotted line curve 94 of FIG. 3. If after two and a half minutes, the unacceptable battery continues to remain under load, curve 94 first increases its voltage from the seventeen and a half volt (17.5 v) minimum to a higher voltage at a very rapid rate and then continues to increase its voltage at a steady but slower rate. Such a performance as indicated by curve 94 of a nonacceptable ten-cell battery pack is normally caused by at least one of its weak cells reverse charging. After about sixty minutes (60 min.) of the unacceptable battery pack being used, at least one of the cells will usually rupture, explode, and then will immediately vent noxious gases and flames from the ruptured cell. This type of performance of a nonacceptable battery pack is of course extremely dangerous to personnel using $LiSO_2$ battery-powered equipment. Moreover, it should now be evident from FIG. 3 that acceptable $LiSO_2$ batteries of either single or multiple cell construction and at a given temperature have noticeably different performance curve characteristics from that of nonacceptable $LiSO_2$ batteries.

By virtue of tester 10, it will not only detect acceptable or nonacceptable battery packs operating at different temperatures, but will prevent explosion of nonacceptable battery packs. Since a battery pack has a start-up voltage followed by either a rapid steep rise or rapid steep drop off in voltage, tester 10 can be operated in a relatively short period of time and provide sufficient reliability in accepting or rejecting a $LiSO_2$ battery. Hence, tester 10 of the invention greatly minimizes dangers to field personnel that would otherwise exist especially if $LiSO_2$ batteries are not tested prior to use.

With reference to FIG. 2, a test cycle between the time period of $t_1$ and $t_5$ is usually no more than forty seconds. Within one-tenth to a half of a second (0.1 to 0.5 of a sec.) between the time period of $t_1$ and $t_3$, a battery being tested by tester 10 is immediately subjected to a start-up voltage test by device 12 and flip-flop 14 as aforedescribed. Just before the end of the test cycle, tester 10 between $t_4$ and $t_5$ automatically subjects a battery by comparator 28 and flip-flop 18 to a voltage output test under load as aforedescribed. Since the end of a test cycle by tester 10 at $t_5$ is about 40 sec., the performance curve of a nonacceptable battery (e.g., curve 94 in FIG. 3) is not near its danger zone where the battery could explode. Since from FIG. 3, it is evident that a battery pack has different performance characteristics for each temperature condition, it is noted here that the negative bias input of comparators 12 and 28 are readily adjusted by their potentiometers 58 and 60 in relation to the temperature of a battery being tested.

In one reduction to practice of tester 10 for evaluating the acceptability of a D-cell battery pack, resistor 21 was provided with a resistance of ten ohms, and capacitor 24 with a capacitance of 0.1 microfarad (0.1 uf). Since the battery pack would have its rated voltage specified and since the temperature is known by the user, negative bias input 54 to comparator 12 was adjusted to provide a comparator threshhold voltage of about eighteen volts (18.0 v) in relation to a battery being tested at a given temperature of about twenty-five degrees Celsius (25° C.). Similarly, negative bias input 56 of comparator 28 was adjusted so as to provide comparator 28 with an output of about seven-tenths of a volt (0.7 v). One of the reasons for the output of device 28 being small is that buffer 26 in having a high input impedance minimizes voltage changes on capacitor 24. Also, an acceptable battery performance curve regardless of battery temperature exhibits a rapid rise in voltage in the first minute or less of battery test performance; and thereafter, the rise or decrease in the performance curve is not rapid but usually very slight. Since tester 10 is primarily of solid-state construction it is easily integrated into existing, battery-powered equipment so as to provide same with its own battery tester. On the other hand, depending on the use requirements of tester, it could be a portable plug-in type module for use with more than one battery-powered equipment. It is to be understood that instead of solenoid switches 40 and 46, suitable transistors may be used.

Figure 4:
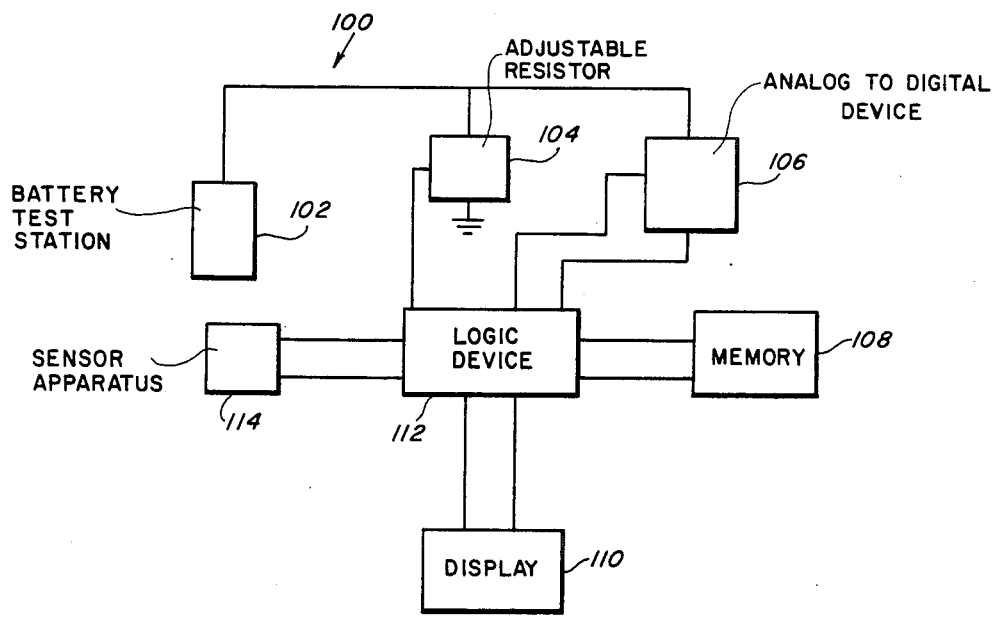
FIG. 4 is a diagrammatic view of another embodiment of the invention.

Another advantageous embodiment of the invention is shown in FIG. 4. A tester 100 is generally made up of a battery test station 102, an adjustable resistor 104, an analog-to-digital device 106, memory 108, a display 110, a logic 112 and a sensor apparatus 114 for measuring temperature, pressure or other parameters. By use of digital circuitry and memory 108, a more versatile tester is provided. Further, apparatus 114 can be provided with temperature sensors not only for ambient conditions but also for sensing the temperature of each cell in a battery to be tested. Thus, tester 100 has greater sensitivity and adjustability than tester 10.

Obviously, many modifications and variations of the present invention are possible in light of the above teachings. It is therefore to be understood that, within the scope of the appended claims, the invention may be practiced otherwise than as specifically described.

What is claimed is:

1. A battery tester for determining the acceptability of a Lithium Sulfur Dioxide (LiSO$_2$) battery having one or more cells therein, said tester comprising:

first and second comparison circuit means and logic means, the first comparison circuit means having a first series of series interconnected components, namely: first comparator means, first and second flip-flop means, and AND gate means, a forward bias input of the first comparator means being connected to a positive battery terminal means, a negative bias input of the first comparator means being connected to negative bias source means, the input of the first flip-flop means being connected to the output of the first comparator means while the output of the first flip-flop means is connected to an input of the AND gate means, the output of the gate means being connected to the input of the second flip-flop means, first resistor means parallel connected to the first comparison circuit means between the first comparator means and the terminal means, the second comparison circuit means having a second series of series interconnected components, namely: second resistor means, capacitor means, buffer means, and second comparator means, the second resistor means being parallel connected to the first comparison means between the first comparator means and the first resistor means, the capacitor means being interposed between and interconnected to the second resistor means and the buffer means, the forward bias input of the second comparator means being connected to the buffer means, the negative bias input of the second comparator means being connected to negative bias source means, the output of the second comparator means being connected to another input of the gate means, normally-open first switch means having solenoid means for selectively closing same, the first switch means being interposed between and interconnected to the first resistor means and a ground, normally-closed second switch means having solenoid means for selectively opening same, the second switch means having one terminal parallel connected to the second comparison circuit means between the capacitor means and the buffer means, the second switch means having another terminal connected to a ground, the logic means having first and second lead means connected to the solenoid means of the first and second switch means respectively, and the logic means having third and fourth lead means connected to another input of the first and second flip-flop means respectively, said first lead means being energized by said logic means to energize the solenoid means of said first switch means so as to close the first switch means at a first predetermined time thereby placing a battery to be tested under load by said first resistor means, said first comparator means for comparing the output terminal voltage of the battery in relation to a predetermined negative biased reference voltage at the negative bias input of the first comparator means when the first switch means is closed, said second lead means being energized by said logic means to energize the solenoid means of the second switch means so as to open the second switch means at a second predetermined time, said second comparator means for comparing the output voltage of the battery in relation to a predetermined negative biased reference voltage at the negative bias input of the second comparator means when the second switch means is opened, said third lead means being energized by said logic means for timely transmitting a first pulse to the other input of the first flip-flop means so as to cause triggering of the first flip-flop means output to the input of the gate means when the voltage output of the first comparator means is sufficient, and said fourth lead means being energized by said logic means for timely transmitting a second pulse so as to cause triggering of an output from said second flip-flop means when the input of the second flip-flop means is energized by the output of said gate means as the result of both inputs of said gate means having simultaneously sufficient voltages from the outputs of both the first flip-flop means and the second comparator means during evaluation of a battery by the tester.

2. A tester as set forth in claim 1 wherein the output of the second flip-flop means is connected to illumination means for indicating the acceptability of a battery evaluated by said tester.

3. A tester as set forth in claim 1 wherein said logic means includes illumination means for indicating when a battery is being evaluated by said tester and for flashing when a battery is unacceptable after being evaluated by said tester.

4. A tester as set forth in claim 1 wherein the solenoid means of said second switch means is energized by said second lead means from about one-tenth (0.1) of a second to about five-tenths (0.5) of a second after the first lead means energizes the solenoid means of the first switch means.

5. A tester as set forth in claim 1 wherein the second lead means energizes the solenoid means of the second switch means for a time period from about twenty (20) seconds to approximately forty (40) seconds.

6. A tester as set forth in claim 1 wherein the negative bias input of each comparator means includes adjustment means.

7. A tester as set forth in claim 1 wherein the adjustment means is adjustable potentiometer means.

8. A tester as set forth in claim 1 wherein said logic means is provided with further means connected to said first and second flip-flop means for reinitiating same after a battery has been evaluated by said tester.

9. A tester as set forth in claim 1 wherein the capacitor means has a capacitance of approximately one-tenth of a microfarad (0.1 uf).

10. A tester as set forth in claim 1 wherein the first resistor means has a resistance of approximately ten (10) ohms.

* * * * *